United States Patent [19]

Smith

[11] 4,255,077
[45] Mar. 10, 1981

[54] METHOD OF ALIGNING

[75] Inventor: Raymond B. Smith, West Midlands, England

[73] Assignee: Lucas Industries Limited, Birmingham, England

[21] Appl. No.: 892,851

[22] Filed: Apr. 3, 1978

[30] Foreign Application Priority Data

Apr. 12, 1977 [GB] United Kingdom ............... 15098/77

[51] Int. Cl.$^3$ ............................................... B65H 9/06
[52] U.S. Cl. .................................. 414/786; 29/281.1; 29/740; 198/345; 269/254 CS; 414/787
[58] Field of Search ....................... 214/152, 1 BB, 65; 29/281.1, 740, 759; 198/345, 434; 269/254 R, 254 CS; 414/35, 749, 787, 786

[56] References Cited

U.S. PATENT DOCUMENTS

| | | | |
|---|---|---|---|
| 3,536,004 | 10/1970 | Derrickson | 101/123 |
| 3,596,704 | 8/1971 | Roe | 198/345 X |
| 3,617,046 | 11/1971 | Sotonyi | 269/254 CS |
| 3,696,491 | 10/1972 | Blumenberg | 269/254 R X |
| 4,064,659 | 12/1977 | Ulivi | 198/345 X |
| 4,148,400 | 4/1979 | Cross | 414/750 |

FOREIGN PATENT DOCUMENTS 1352980  5/1974  United Kingdom ..................... 269/254
1447643  9/1976  United Kingdom ..................... 269/254

Primary Examiner—L. J. Paperner
Attorney, Agent, or Firm—Holman & Stern

[57] ABSTRACT

This invention relates to a method of locating a rectangular board including a printed circuit board on a support for correctly positioning the board relative to an electrical component inserting machine which inserts terminals of the components into pre-drilled holes in the printed circuit board. The board is provided with one V-shaped notch in the center of each of its end edges and in one of its side edges. The board is disposed roughly in position on the support which has three retractable spring loaded locators thereon in positions corresponding to the notches, and retractable spring loaded abutment pad. Rough positioning of the board on the support is assisted by a pair of diagonally opposed right angle guides on the support. The board is mounted on the support with the locators and the pad retracted. Then the locator at the end edges of the board are released so that V-shaped wedges thereon engage in the respective notches in the end edges of the board. Finally the other locator and the abutment pad are released to engage respectively in the notch in one side edge and against the other side edge of the board. Thus, the board is centered accurately on the support with known tolerance errors.

20 Claims, 5 Drawing Figures

U.S. Patent  Mar. 10, 1981  4,255,077
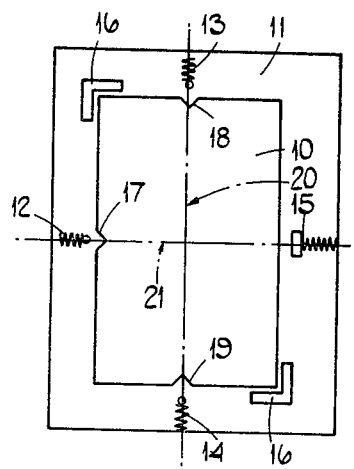
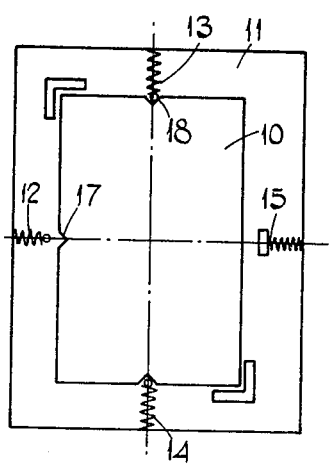
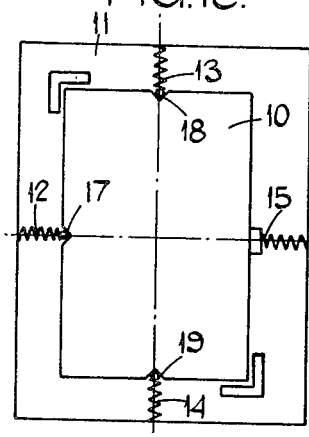
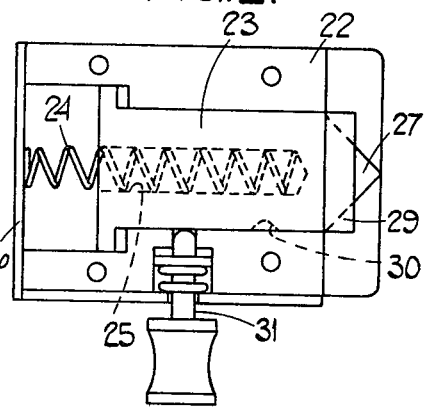
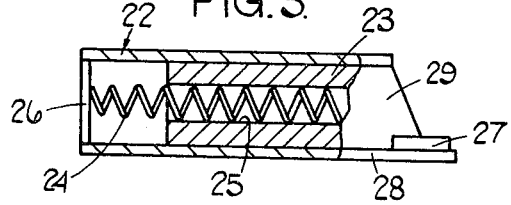

METHOD OF ALIGNING

BRIEF SUMMARY OF THE INVENTION

This invention relates to a method of locating a board or other substantially two-dimensional article (hereinafter referred to simply as "board") on a support for the purpose of performing an operation thereon. The invention is more particularly, though not exclusively, concerned with a method of locating a printed circuit board having pre-drilled holes therein on a support for the purpose of inserting terminals of electrical components into the pre-drilled holes in the board.

In order to mechanize the production of electrical circuits on printed circuit boards, it is commonly the practice to provide printed circuit boards which have been pre-drilled at specific locations with holes designed to receive the terminals of electrical components to be secured to the boards. The pre-drilled electric circuit boards are then located on a support of a machine for inserting the terminals of electrical components. In order for this operation to be effective, it is necessary for the position of the holes to be known with respect to the terminal inserting machine and therefore it is essential to be able to locate the printed circuit boards consistently in the correct position with respect to the machine. One previous method of effecting this operation has been to provide a locating hole at each end of a board of which the printed circuit board forms part and to engage these locating holes over respective locating pins projecting from the support. Particularly in the case of high volume printed circuit board production, it is not possible to ensure that the locating holes are provided consistently at the same location in each and every board. This is because such boards are produced by blanking and piercing a larger mother board at an elevated temperature to avoid brittle fracture of the board with the subsequent return of the individual printed circuit boards into the larger mother board for ease of handling. The return of the individual printed circuit boards into the larger mother board sets up stress patterns that expand and dish the mother board. This is because the addition of burrs and fraze effectively make the individual printed circuit boards larger than the holes from which they came. Thus, in order to avoid the possiblity that some boards will not fit over the locating pins, it is the practice to make one of the locating pins undersized by an amount equal to the tolerance in the direction in which the locating pins are spaced. This reduces the positional accuracy of the board and ensures that the board will be zeroed about the hole with the closer fitting locating pins. Thus, the positional error of holes in the vicinity of the latter locating pin is minimized but the position of error holes in the region of the other locating pin is maximized. Another parameter that influences the final positional accuracy of the board relative to the support is the variability in the diameters of the locating holes. This is compensated for by reducing the diameters of both locating pins by the tolerance on the diameters of the locating holes, thus leading to a further reduction in the positional accuracy and axis alignment of the board with maximized errors at one end of the board.

Thus, it is difficult to ensure correct operation of the electrical component insertion machine even when the latter can be controlled to accommodate for tolerance build-up. For such a machine to operate effectively, it is necessary to know the direction in which the tolerance is building up and this cannot be predicted with the above-described locating pin and hole arrangements.

An object of the present invention is to mitigate this disadvantage.

According to the present invention, there is provided a method of locating a board on a support, comprising the steps of providing at respective side edges of the board a pair of V- or other tapered formations, said formations being directed along mutually transverse axes which intersect generally centrally of the board, positioning the board on the support, and engaging a pair of locators on the support respectively with the formations on the board, each locator being urged by a force acting along the respective axis towards the point of intersection of the axes and serving to urge the board against an abutment on the respective axis.

Preferably, the abutment on one of the axes is defined by a further urged locator engaging in a further V- or other tapered formation in the board. The abutment for the other axis may be in the form of a resiliently mounted abutment pad.

In another embodiment, the abutments are provided by portions of a location member fixed relative to the support and engaged in a hole in the board centered on the intersection of the axes.

In order to reduce positioning errors to a minimum, it is preferred to provide the intersection of the axes at the center of the board since the further the intersection of the axes is from the center of the board, the higher will be the positioning error. It is, however, within the scope of the present invention to provide the intersection of the axes at a point which is not centered on the board and this may be necessary in cases where the design of the board does not allow a hole to be located at the center thereof when the embodiment described in the last preceding paragraph is chosen.

The mutually transverse axes are preferably mutually perpendicular.

The formations provided in the board are preferably in the form of notches and, in the case of notches of a V shape, it is preferred for the sides of the V to be disposed at 45° to the respective axis.

The locators may have arcuate portions which engage in the respective notches so as to provide, effectively, a two point contact therewith. However, for practical reasons, it is preferred to provide locators with V-shaped engagement surfaces. Preferably, each locator is provided with a disengageable stop for holding the locator in the retracted position. Each locator may be provided with a shoulder thereon to engage over the board to prevent the latter from lifting off the locator.

Preferably, each locator is resiliently urged against the respective formations.

Also according to the present invention, there is provided a support constructed and adapted to carry out the above method and having said pair of locators and abutments mounted thereon.

BRIEF DESCRIPTION OF THE SEVERAL VIEWS OF THE DRAWINGS

An embodiment of the present invention will now be described, by way of example, with reference to the accompanying drawing, in which:

FIGS. 1(*a*), 1(*b*) and 1(*c*) are views showing various steps in a method of locating a board according to one embodiment of the present invention.

FIG. 2 is a plan view of a locator for use in the method of FIGS. 1(a) to 1(c) shown with a part of a housing thereof removed, and FIG. 3 is a part sectional side view of the locator of FIG. 2.

Referring to the drawing, a rectangular board 10 is to be accurately located in the desired position on a rectangular support 11 adjacent an electrical component inserting machine (not shown). The rectangular board 10 is partly comprised by a printed circuit board which has been pre-drilled with holes (not shown) which are to receive the terminals of electrical components to be inserted by the machine. The support 11 has three spring-loaded locators 12, 13 and 14 and a spring-loaded abutment pad 15 mounted thereon. The locators 13 and 14 are mutually aligned as are the locator 12 and the abutment pad 15. The axes on which the locators 13 and 14 and the locator 12 and pad 15 are respectively located are disposed mutually at right-angles and intersect at the center of the support 11. Also mounted on the support 11 are a pair of diagonally opposed right angle guides 16 upstanding from the support 11. The board 10 is to be mounted over an aperture (not shown) in the support 11 and has a respective V-shaped notch 17, 18, 19 in each of three of its edges. The notch 17 is provided midway along one of the longitudinal side edges of the board 10. The notches 18 and 19 are provided midway along respective end edges of the board 10. Thus, the notches 18 and 19 are arranged so as to be directed along an axis 20 which is disposed at right angles to an axis 21 passing through the center of notch 17, the axes 20 and 21 intersecting at the center of the board 10.

Each notch 17, 18 or 19 has its side edges disposed at 45° relative to the respective axis 20, 21. Thus, the sides of each notch 17, 18 or 19 are 90° apart.

Each locator 12, 13 or 14 comprises a housing 22 which is fixedly mounted on the support 11, an element 23 slidable within the housing 22 and a spring 24 lodged in a bore 25 in the element 23 and abutting against an end wall 26 of the housing 22. An end of the element 23 remote from the spring 24 projects externally of the housing 22 and is provided with a hardened wedge 27 of a shape which corresponds to that of the respective notch 17, 18 or 19. The wedge 27 is disposed adjacent a base 28 of the housing 22 and is detachably engaged with the element 23 to enable removal thereof for regrinding or replacement purposes. A portion 29 of the end of the element 23 disposed above the wedge 27 extends laterally beyond the tapered side edges of the wedge 27. Internally of the housing 22, the element 23 has a recess 30 therein which is engaged with the manually operable spring loaded plunger 31 when the element 23 is in a retracted condition to hold the latter in said position against the action of the spring 24. It is to be noted that, in FIGS. 1(a) to 1(c) the locators 12, 13 and 14 are provided with respective balls or cylinders in the place of wedges 27. Although the use of balls or cylinders is preferred from a theoretical point of view, the use of wedges 27 is more practical and it is this latter embodiment which will be described hereinafter.

In order to locate the board 10 in the desired position on the support 11 relative to the machine, the board 10 is placed onto the support 11 with the locators 12, 13 and 14 retracted and held in their retracted position by means of the plungers 31 which are engaged in the respective recesses 30. The abutment pad 15 is also held in a retracted position by a similar arrangement to that described in relation to the locators 12, 13 and 14. The board 10 is roughly positioned on the support 11 using the L-shaped guide 16 which engage diagonally opposite corners of the board 10 (see FIG. 1(a)). Following this, the manually operable plungers 31 associated with locators 13 and 14 are retracted so that the respective springs 24 urge the locators into engagement with the respective V-shaped notches 18 and 19. This operation accurately positions the axis 20 of the board 10 on the axis on which the locators 13 and 14 are centered (see FIG. 1(b)). In this position, lateral movement of the board 10 longitudinally of the axis 21 is prevented. It will be appreciated that the element 23 and housing 22 of each locator will have their mutually abutting side edges manufactured to machine guide way tolerances. However, due to the provision of the springs 24 in the respective locators 13 and 14, it is possible for the board 10 to move longitudinally of the axis 20 as permitted by compression of either spring 24. In order to prevent this, the manually operable plunger 31 associated with locator 12 and that associated with the abutment pad 15 are released so that the wedge 27 of the locator 12 engages in the notch 17 and the abutment pad 15 is resiliently urged into engagement with the side edge of the board 10 opposite that in which the notch 17 is provided. This action prevents movement of the board 10 longitudinally of the axis on which the locator 13 and 14 lie so that the axes 20 and 21 of the board 10 are accurately located on the aforementioned axes of the support 11. Thus, the center of the board 10 is accurately located in the desired position. Expansion and contraction errors in the board 10 are then centered on the center of the board 10 with the result that maximum errors at the four corners of the board 10 are only plus or minus half of the maximum expansion/contraction error across the whole of the board 10. Any tendency for the board 10 to bow as a result of the operations to which it has been subjected prior to being disposed on the support 11 is counteracted by the portions 29 of the locators 12, 13 and 14 which engage against the upper surface of the board 10 to maintain it flat against the support 11. The abutment pad 15 is also provided with a shoulder (not shown) for this purpose.

In an alternative embodiment (not shown), where the design of the board permits, a hole is provided at the center of the board for engagement over a location pin projecting upwardly from the support. The locator 13 and the abutment rod 15 are dispensed with as is the notch 18. In use, the board is disposed on the support with the location pin projecting into the hole at the center of the board. Then the locator 14 is engaged with the notch 19 and the locator 12 engaged with the notch 17 to oppose movement of the board longitudinally of both of axes 20 and 21 as permitted by any tolerance errors in the sizing of the hole and location pin to prevent rotation of the board about the axis of the location pin.

I claim:

1. A method of locating a board at a precise location on a support, comprising the steps of providing a respective formation on, and intermediate the ends of, each of two adjacent side edges of the board, said formations being directed along respective axes which intersect generally centrally of said board, each said formation having a pair of mutually tapered side edges disposed in the plane of said board; positioning said board on said support; and engaging a pair of locators on said support with the respective formations on the board so that said locators engage the mutually tapered side edges of the respective formations, each locator being urged by a force acting along an axis on which a respective abutment of the support lies, the axes along which said forces act being mutually intersecting so that each locator serves to urge the board against the respective abutment whereby the axes along which said formations are directed are accurately aligned with the axes along which the locators act.

2. A method as claimed in claim 1, wherein the abutment on one of the axes is defined by a further urged locator engaging in a further formation having a pair of mutually tapered side edges disposed in the plane of the board.

3. A method as claimed in claim 2, wherein the abutment for the other axis is in the form of a resiliently mounted abutment pad.

4. A method as claimed in claim 1, wherein the abutments are provided by portions of a location member fixed relative to the support and engaged in a hole in the board centered on the intersection of the axes.

5. A method as claimed in claim 1 wherein the respective axes which intersect generally centrally of said board are mutually perpendicular.

6. A method as claimed in claim 2, wherein the formations provided in the board are in the form of notches.

7. A method as claimed in claim 6 wherein said mutually tapered side edges are disposed at 45° to the respective axes.

8. A method as claimed in claim 1 wherein the locators have arcuate portions which engage with the respective formation so as to provide effectively, a two point contact therewith.

9. A method as claimed in claim 7 wherein the locators have V-shaped engagement surfaces.

10. A method as claimed in claim 1, wherein each locator is provided with a disengageable stop for holding the locator in the retracted position.

11. A method as claimed in claim 1 wherein each locator is provided with a shoulder thereon to engage over the board to prevent the latter from lifting off the locator.

12. A method as claimed in claim 1, wherein each locator is resiliently urged against the respective formation.

13. A support constructed and adapted to carry out the method as claimed in any preceding claim and having said pair of locators and abutments mounted thereon.

14. A method as claimed in any one of claims 2–4 or 6–12, wherein the respective axes which intersect generally centrally of said board are mutually perpendicular.

15. A method as claimed in any one of claims 2–5 or 7–12, wherein the formations provided in the board are in the form of notches.

16. A method as claimed in any one of claims 2–7 or 10–12, wherein the locators have arcuate portions which engage with the respective formation so as to provide effectively, a two point contact therewith.

17. A method as claimed in any one of claims 2–6 or 10–12, wherein the locators have V-shaped engagement surfaces.

18. A method as claimed in any one of claims 2–9, 11, or 12, wherein each locator is provided with a disengageable stop for holding the locator in the retracted position.

19. A method as claimed in any one of claims 2–10 or 12 wherein each locator is provided with a shoulder thereon to engage over the board to prevent the latter from lifting off the locator.

20. A method as claimed in any one of claims 2 and 4–11, wherein each locator is resiliently urged against the respective formation.

* * * * *